(12) United States Patent
Mechler

(10) Patent No.: US 7,112,780 B2
(45) Date of Patent: Sep. 26, 2006

(54) DETECTOR UNIT

(75) Inventor: Arno Mechler, Waldkirch (DE)

(73) Assignee: Sick AG, Waldkirch (DE)

( * ) Notice: Subject to any disclaimer, the term of this patent is extended or adjusted under 35 U.S.C. 154(b) by 211 days.

(21) Appl. No.: 10/611,640

(22) Filed: Jun. 30, 2003

(65) Prior Publication Data

US 2004/0031910 A1 Feb. 19, 2004

(30) Foreign Application Priority Data

Jul. 1, 2002 (DE) ............................... 102 29 428

(51) Int. Cl.
*G01J 1/04* (2006.01)
*G02B 6/26* (2006.01)
*G02B 6/12* (2006.01)

(52) U.S. Cl. ........................ 250/227.11; 250/227.24; 385/14

(58) Field of Classification Search ........... 250/227.11, 250/227.24, 227.31, 214 R; 398/164, 139, 398/142, 60, 138, 141, 165; 385/14, 24, 385/88, 89, 92, 94
See application file for complete search history.

(56) References Cited

U.S. PATENT DOCUMENTS 4,732,446 A * 3/1988 Gipson et al. ................ 385/24
4,850,044 A * 7/1989 Block et al. ................ 398/118
5,093,890 A * 3/1992 Bregman et al. ........... 385/146
5,920,664 A * 7/1999 Hirabayashi et al. ......... 385/16
6,832,014 B1 * 12/2004 Vogley ........................ 385/16
6,842,571 B1 * 1/2005 Kramer et al. ................ 385/47

FOREIGN PATENT DOCUMENTS

| DE | 69214593 T2 | 2/1997 |
| DE | 69126065 T2 | 10/1997 |
| DE | 19711121 A1 | 1/1998 |
| DE | 19815389 A1 | 10/1999 |
| DE | 69331087 T2 | 6/2002 |
| EP | 1096456 A2 | 5/2001 |
| EP | 1096608 A2 | 5/2001 |
| EP | 1178457 A1 | 2/2002 |

* cited by examiner

*Primary Examiner*—Georgia Epps
*Assistant Examiner*—Don Williams
(74) *Attorney, Agent, or Firm*—Townsend and Townsend and Crew

(57) ABSTRACT

The invention relates to a detector unit which is made for connection to an optical bus which is formed by detector units of the same type arranged adjacently. The detector unit has a light transmitter, a light receiver and at least one optical connection path by which two optical interfaces are optically connected. At least one optical anomaly is arranged along the optical connection path which is made for the coupling of light of the light transmitter into the optical connection path and for the coupling of light out of the optical connection path to the light receiver.

16 Claims, 5 Drawing Sheets

DETECTOR UNIT

BACKGROUND OF THE INVENTION

The invention relates to a detector unit which is designed for connection to an optical bus which is formed by detector units of the same type arranged adjacently.

Such detector units serve, for example, as sensor devices, in particular as light barriers, diffuse sensors, inductive proximity switches, capacitive proximity switches or ultrasonic sensors. In some applications a plurality of such detector units are used in a close spatial arrangement to pick up a plurality of measurement values simultaneously. A common control of these detector units and a data flow between the detector units among one another is required here. For this purpose, the detector units are connected to a common data bus.

It is known for the forming of this data bus to provide a galvanic plug connection between the adjacent detector units. Such a connection, however, has an insufficient protection category for some applications.

Detector units have therefore been developed for demands with a higher protection category which have a respective optical interface and an associated photoelectrical transceiver at two opposing housing sides, with the optical interfaces of two adjacent detector units being provided in a congruent arrangement. An optoelectronic bus, which allows a bidirectional communication between the adjacent detector units, is thereby formed via the two photoelectrical transceivers electrically connected to one another and the associated optical interfaces of this detector unit with adjacent detector units.

A disadvantage of this design lies in the fact that the data communication, in particular the synchronization, takes a response time which is undesirably long for some applications since a signal to be transmitted along the formed bus has to be transformed, starting from an optical signal, into an electrical signal and back into an optical signal within each detector unit. Moreover, the design of the detector units explained is comparatively complex and therefore undesirably expensive.

SUMMARY OF THE INVENTION

An object of the invention therefore consists of providing a detector unit which allows fast data communication with detector units of the same type arranged adjacently with a favorably priced design and a high protection category.

This object is satisfied in that the detector unit has a light transmitter, a light receiver and at least one optical connection path by which two optical interfaces are optically connected to one another; and in that at least one optical anomaly is arranged along the optical connection path which is designed to couple light of the light transmitter into the optical connection path and to couple light out of the optical connection path to the light receiver.

In the detector unit in accordance with the invention, at least one continuous optical connection path is therefore provided which extends between two optical interfaces. These allow an optical link to one detector unit with a corresponding optical interface arranged adjacently in each case. An optical anomaly at the optical connection path allows a coupling and uncoupling of light signals from the light transmitter or to the light receiver.

The respective optical connection paths are thus connected by a plurality of such detector units arranged adjacently to one another via the respective optical interfaces to form a single, continuous optical connection path, with each optically coupled detector unit being able to couple light signals into this connection path and to receive light signals from this common connection path. A purely optical bus is thus formed in which the coupling of the detector units arranged adjacently to one another takes place in an optical manner such that no multiple transformation between optical and electrical signals is required for the signal transmission between different detector units. An optoelectronic transformation only takes place when a signal should be fed into or taken out of the optical bus.

An advantage of the invention thus consists of the signal transmission between any desired detector units being possible without any particular time loss. All detector units can thus be synchronized simultaneously without the response times of the individual detector units being added to one another.

A further advantage of such detector units consists of every detector unit being able to communicate at any time with every other desired detector unit such that a particularly efficient communication of a system of a plurality of detectors is possible.

It is moreover unimportant for the communication of a detector unit with another detector unit of a system of a plurality of such detector units whether the light transmitter or the light receiver of a detector unit lying therebetween is defective, since the communication runs exclusively along the commonly formed optical connection path. A system of a plurality of detector units in accordance with the invention is thus particularly resistant to disturbances with respect to a defect of an individual detector unit.

Furthermore, a detector unit in accordance with the invention can be produced in a comparatively favorably priced manner since only one single light transmitter and one single light receiver are required.

To the extent that reference is made in connection with the invention to the transmission of light, electromagnetic radiation of the ultraviolet or of the infrared spectral range is also to be understood by this.

In accordance with a preferred embodiment, the optical connection path within the detector unit is formed by a light guide, that is, by a solid body of an optically dense material. Alternatively to this, a reflecting passage, that is, an internally reflecting hollow body, can also be provided.

The optical connection path preferably extends inside the detector unit in a straight light from one housing side to an opposite housing side.

The optical interface at an end of the optical connection path can, for example, be formed by a transparent terminal window or by a housing section transparent to the wavelength used.

The optical anomaly provided at the optical connection path can, for example, be a totally reflecting recess of the connection path, in particular of a light guide. This recess can have any desired shape, in particular a round shape or a prismatic shape. Alternatively to this, the optical anomaly can also have one or more partly transmitting reflection elements, for example partly transmitting mirrors.

It is furthermore preferred for the detector unit to have one single optical connection path which opens into the optical interfaces at both ends and at which both the light transmitter and the light receiver are arranged.

Alternatively to this, however, it is also possible for the detector unit to have two optical connection paths, with the light transmitter being associated with the one connection path and the light receiver being associated with the other connection path. Two different optical connection paths, in particular extending parallel to one another, are therefore formed by a system of a plurality of such adjacent detector units to one another.

The invention also relates to a system having a plurality of detector units of the explained type which together form an optical bus in tandem connection.

Such a system can furthermore have one or more adapter units to be able to connect a plurality of groups (clusters) of adjacent detector units to one another optically or by optoelectronic repeaters.

Furthermore, such a system can have one or more terminal units which allow an optical termination of the ends of a series of adjacent detector units arranged adjacently to one another such that the light guided within the commonly formed optical connection path does not exit the connection path at an end face.

Finally, such a system can also have a control unit for the synchronization of the optical bus formed by the detector units. Such a control unit can in particular have an optical interface and a light transmitter and a light receiver to allow communication with the connected detector units. For this purpose, a specifically formed control unit can be provided which in particular has a special interface for the connection of an additional control unit, for example of a portable computer. Alternatively to this, any desired detector unit of the system can also take over the function of the control unit, for example on the basis of a corresponding activation by means of a dip switch.

The invention will be explained in the following by way of example with reference to the drawings.

DESCRIPTION OF THE PREFERRED EMBODIMENTS

Figure 1:
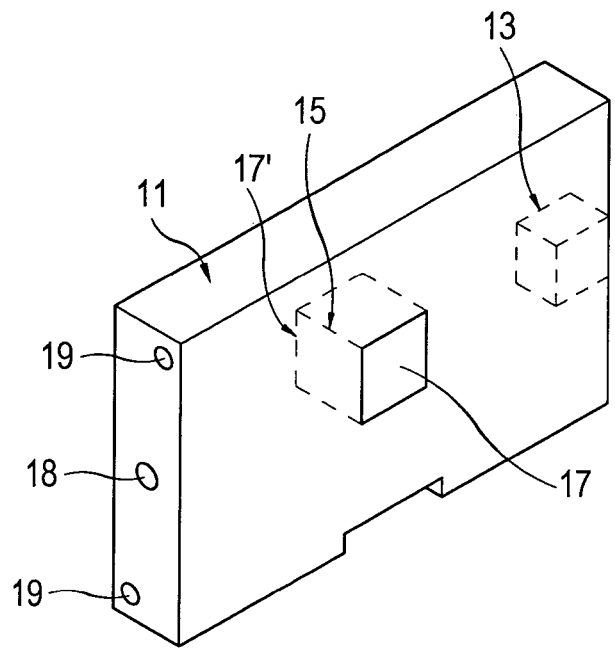
FIG. 1 is a schematic perspective view of a detector unit in accordance with the invention.

FIG. 1 shows a detector unit 11 in accordance with the invention having an integrated sensor device 13, for example a diffuse sensor, or having a part 13 thereof, for example a sensor interface. Such an interface can make the connection of connecting means possible, for example of electrical cable or of light guides, to a remotely installable optoelectronic, inductive or other sensor head (not shown in FIG. 1).

The detector unit 11 has an optical connection path 15 which, starting from an optical interface 17 which is arranged at the housing side of the detector unit 11 shown in FIG. 1 and is formed by a transparent terminal window, extends in a straight line to an optical interface 17' at the opposite housing side. An optical anomaly is formed at the optical connection path 15 and a light transmitter and a light receiver are arranged, as will still be explained in the following.

Furthermore, optionally at least one control signal input/output 18 and electrical terminals 19 are provided at the housing side of the detector unit 11 shown in FIG. 1 which in a manner known per se make signal lines available or serve for the energy supply.

Figure 2:
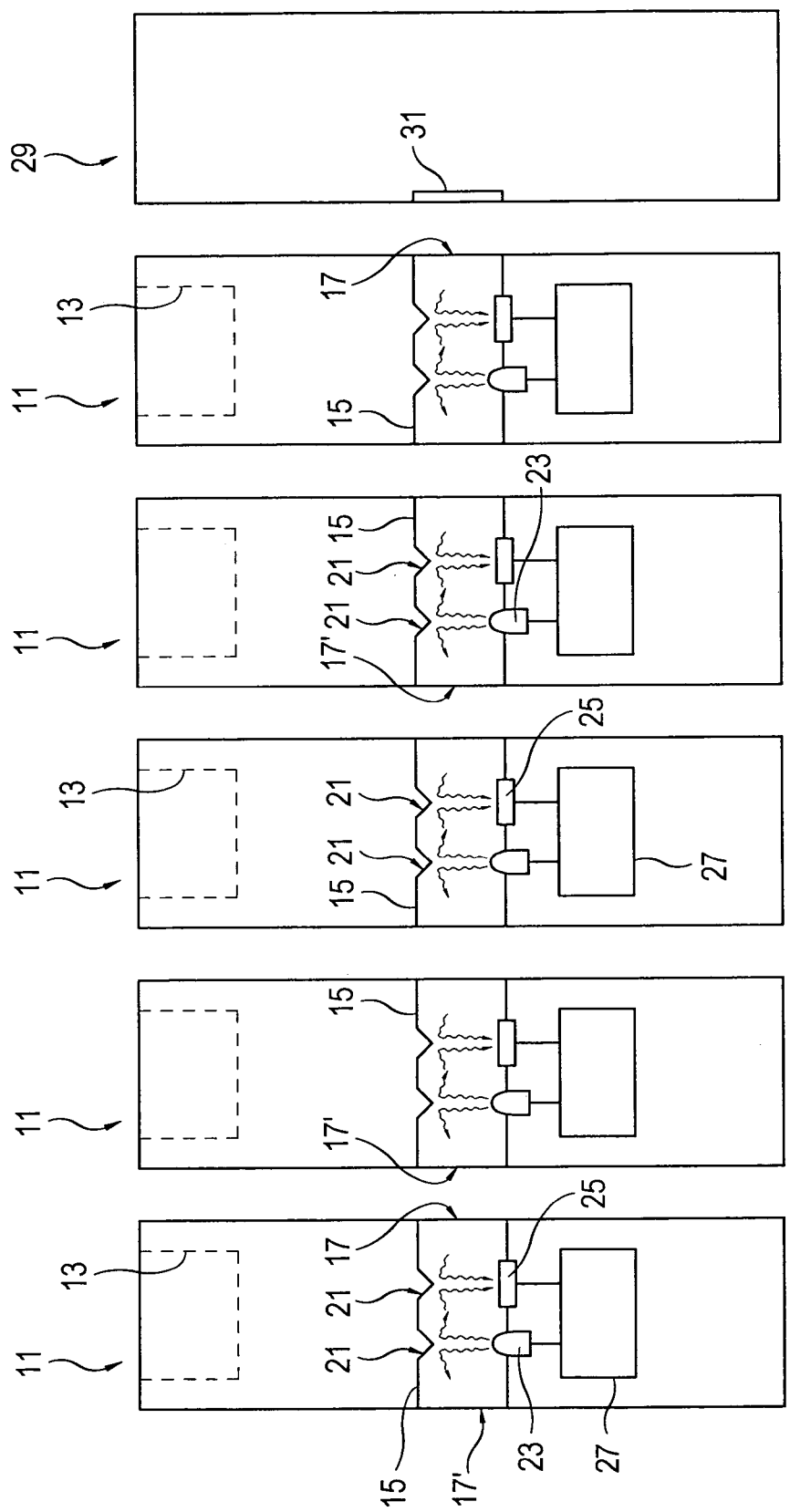
FIG. 2 is a schematic plan view of a system of a plurality of detector units arranged in series adjacently to one another.

FIG. 2 shows a system of five detector units 11 of the type explained with reference to FIG. 1. The optical connection path 15 of each detector unit 11 is formed by a light guide which is provided with two recesses 21 of a triangular outline. A light transmitter 23, for example a light-emitting diode, is optically connected to the connection path 15 opposite the one recess 21. A light receiver 25, for example a photodiode, is optically coupled to the connection path 15 opposite the respectively other recess 21. Each detector unit 11 thus has a single light transmitter 23 and a single light receiver 25 which are connected to a control circuit 27. The control circuit 27 is electrically connected to the respective sensor device 13 in a manner not shown in FIG. 2.

The optical interfaces 17, 17', the recesses 21, the light transmitter 23 and the light receiver 25 of a detector unit 11 are arranged such that, on the one hand, the optical interfaces 17, 17' are optically connected to one another and, on the other hand, every optical interface 17, 17' is also optically connected to the light transmitter 23 and to the light receiver 25. In other words, transmitted light of the light transmitter 23 is reflected in the direction of each of the two optical interfaces 17, 17' and the light entering into the optical connection path 15 from the two optical interfaces 17, 17' is reflected—at least partly—in the direction of the light receiver 25.

As can be seen from the plan view in accordance with FIG. 2, the optical interfaces 17, 17' of the detector units 11 arranged adjacently to one another are arranged congruently such that the optical connection paths 15 of the individual detector units 11 form a common, straight-line optical connection path of the system shown.

In this manner, all detector units 11 are in direct optical contact such that, for example, the detector unit 11 shown at the left in FIG. 2 can communicate with the light receiver 25 of the middle detector unit 11 via its light transmitter 23. The system shown thus has a very low response time for any desired communication between two or more detector units 11, and a plurality of or all detector units 11 can be controlled simultaneously.

It must still be noted with respect to the system shown in FIG. 2 that the individual detector units 11 can also be arranged closely next to one another, and in particular in direct optical contact of the respective optical interfaces 17, 17', in order to avoid or to reduce losses of the light guided along the optical connection path 15.

To reduce the optical losses, reflecting terminal elements can be provided at the ends of the common optical connection path formed by the individual optical connection paths 15 and reflect the light reaching the respectively outermost optical interface 17 or 17' back into the relevant optical connection path 15. A terminal unit 29 is shown by way of example in FIG. 2 which is provided with a terminal reflector 31 in a congruent arrangement with the optical interface 17 of the adjacent detector unit 11. The terminal reflector 31 can be formed, for example, as an adhesive label with metallized plastic. Such terminal units 29 can also be provided at both ends of the arrangement of detector units 11 shown in series-like arrangement in FIG. 2.

Alternatively to this, the optical interfaces 17, 17' of all detector units 11 can also be formed as terminal adapters which allow a connection or placing on of a reflecting terminal element, provided that the relevant detector unit 11 is provided for the arrangement at the end face of a series of detector units 11.

Finally, it must still be noted with respect to the detector units 11 in accordance with FIG. 2 that the light transmitter 23 and the light receiver 25 of a detector unit 11 can be formed, in particular together with the control circuit 26, by a single transceiver element. A particularly favorably priced production and integration into the relevant detector units 11 is thereby possible.

Figure 3:
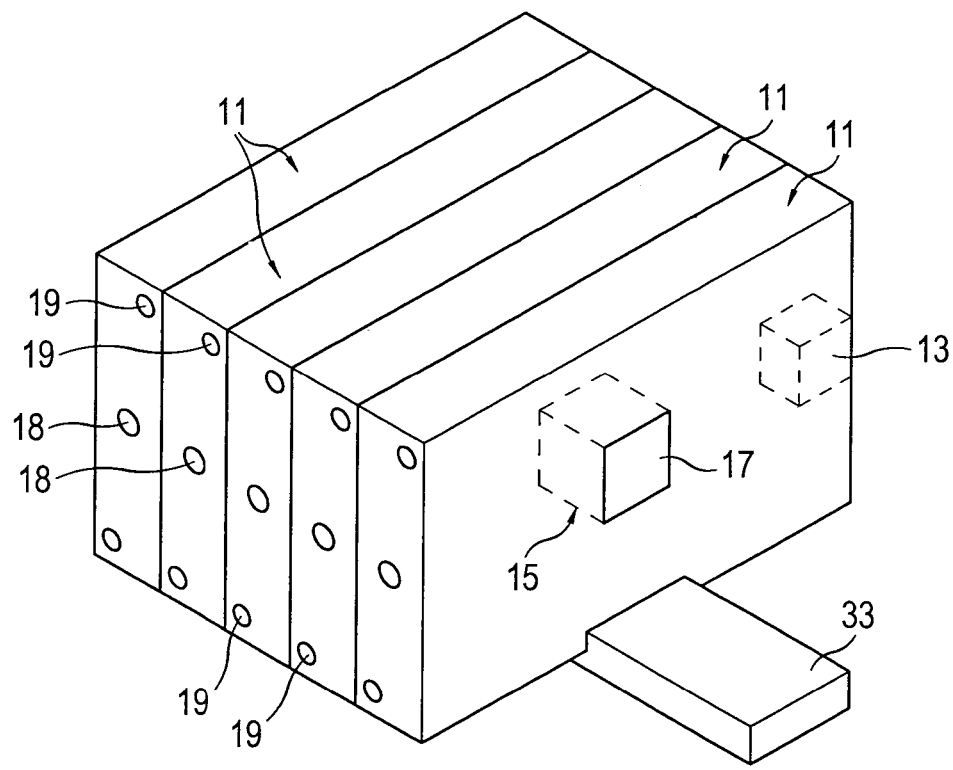
FIG. 3 is a schematic perspective view of a system of a plurality of detector units arranged in series adjacently to one another.

FIG. 3 shows a perspective view of a series-like arrangement of a system of a plurality of detector units 11 in accordance with FIG. 2. The detector units 11 are here mounted on a common terminal rail 33 which ensures the required mechanical hold and can furthermore be equipped with additional electrical contacts. In the embodiment in accordance with FIG. 3, the detector units 11 are in direct areal contact with one another.

Figure 4:
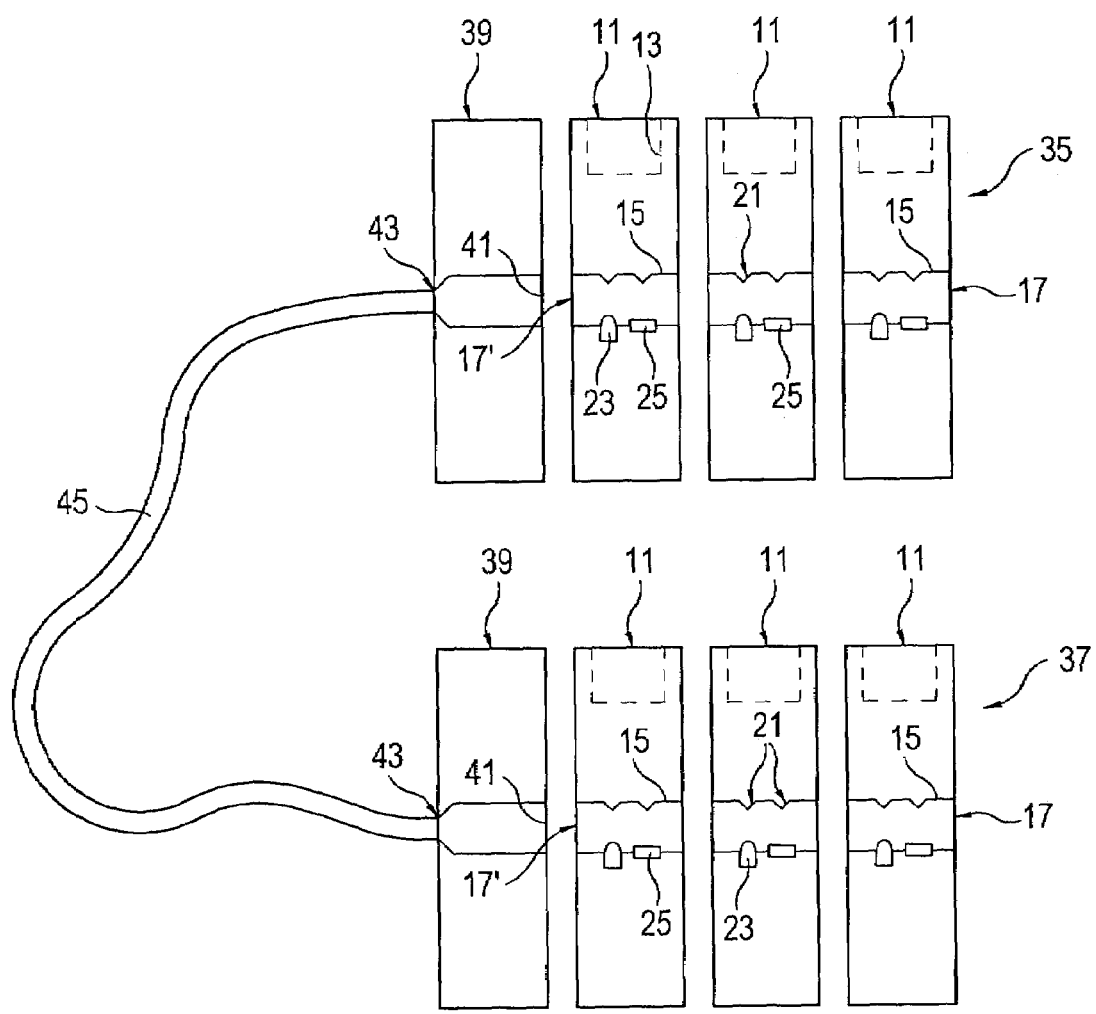
FIG. 4 is a schematic plan view of a system of clustered detector units, with the individual clusters being connected to one another by lightwave guides and by a corresponding adapter or repeater.

FIG. 4 shows an embodiment of a system having a clustered arrangement of detector units 11. The detector units 11 are associated either with a first group 35 or with a second group 37. An adapter unit 39 is arranged at respectively one end of each group 35, 37 such that an optical interface 41 of this adapter unit 39 is arranged congruently with the optical interface 17' of the adjacent detector unit 11 of the relevant group 35 or 37.

A light guide output 43 is optically connected to the optical interface 41 of the adapter unit 39, for example via an optical connection path similar to that of the detector unit 11. Alternatively to this, the optical interface 41 can also be connected to the light guide output 43 in an optoelectronic manner. For example, the adapter unit 39 can have an optoelectronic repeater in which the light signal is converted intermittently into an electric signal and back again into a light signal such that a signal amplification is possible within the adapter unit 39.

The light guide outputs 43 of the two adapter units 39 are optically connected to one another via a flexible connection light guide 45.

The common optical connection path of the first group 35 of detector units 11, which is formed by the individual optical connection paths 15 of these detector units 11, is thus in optical connection with the common optical connection path of the second group 37. In the system shown in FIG. 4, all detector units 11 can thereby optically communicate with one another directly although the detector units 11 of the first group 35 are not arranged directly adjacently to the detector units 11 of the second group 37.

It must still be noted with respect to the embodiment in accordance with FIG. 4 that terminal units or terminal elements can also be provided at the detector units 11 of each group 35, 37, which are arranged at the opposite end of the relevant group 35 or 37 with respect to the respective adapter unit 39, as already explained in connection with FIG. 2.

It must also be noted that a terminal adapter can also be provided at the optical interface 17, 17' of each detector unit 11 for the direct connection of a connection light guide 45 so that the necessity for a separate adapter unit 39 can be dropped.

Figure 5:
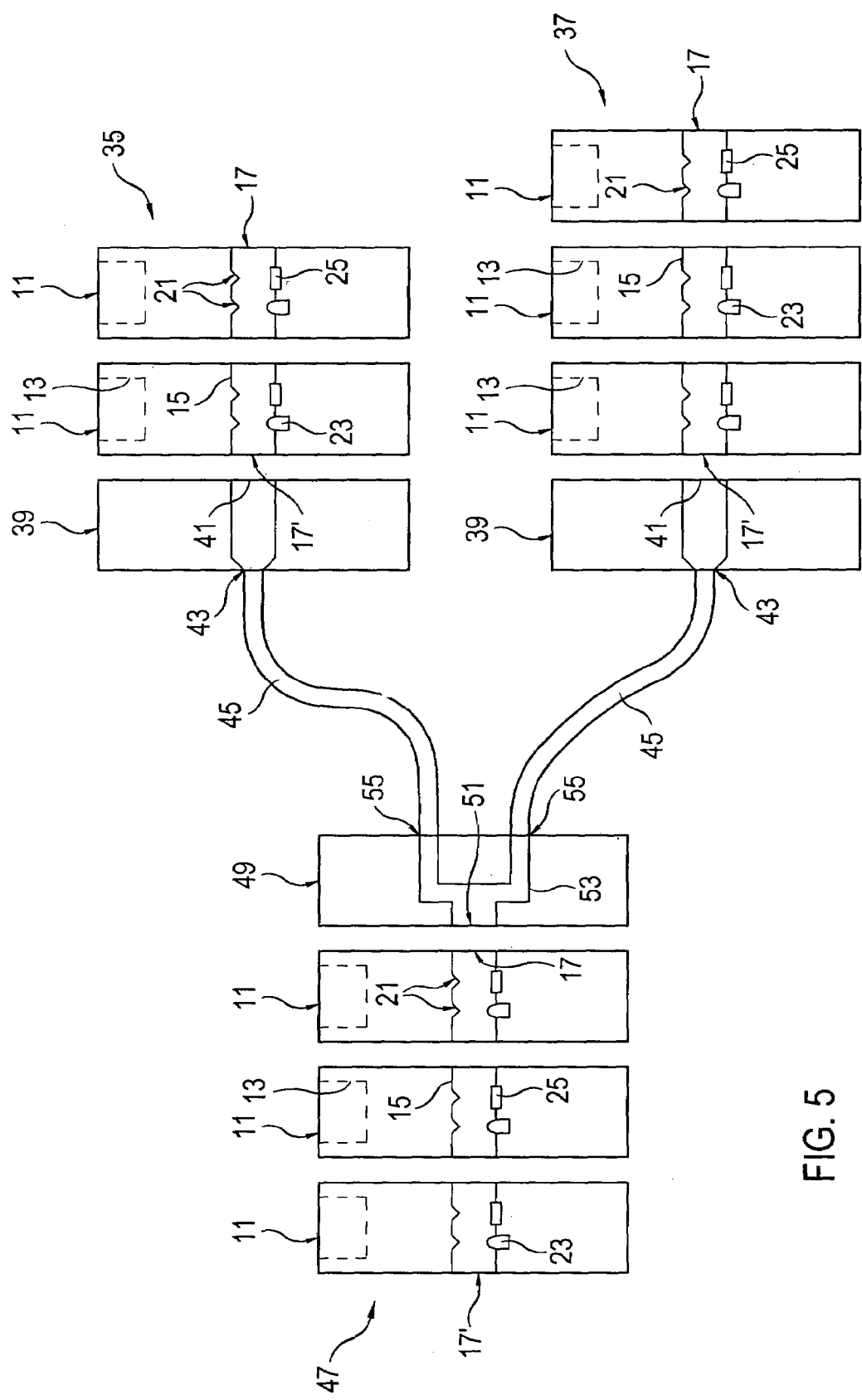
FIG. 5 is a schematic plan view of a star-shaped system of detector units.

FIG. 5 shows an embodiment of a system of a plurality of detector units 11 of the same type, with the detector units 11 being divided into a first group 35, a second group 37 and a third group 47. The detector units 11 of all groups 35, 37, 47 are in direct optical connection.

This is achieved in that the groups 35, 37—as already explained in connection with FIG. 4—are each provided with an adapter unit 39 which makes possible the connection of a respective connection light guide 45. Furthermore, an end of the series-like arrangement of detector units 11 formed by the third group 11 is provided with an adapter unit 49 which has an optical interface 51 which is arranged congruently with the optical interface 17 of the adjacent detector unit 11. Starting from this optical interface 51, an optical connection passage 53 extends which opens at two light guide outputs 55. One each of the connection light guides 45 is respectively coupled to the light guide outputs 55, the connection light guides establishing the optical connection to the first group 35 or to the second group 37.

All detector units 11 of the system shown in FIG. 5 are thus in direct optical contact with one another. The connection light guides 45 allow any desired star-shaped arrangement of the three groups 35, 37, 47 relative to one another due to their flexibility.

More than three groups 35, 37, 47 of detector units 11 can also be connected to one another in the manner explained with reference to FIG. 5, in particular by use of an adapter unit 49 having an even larger number of optical interfaces 51 or light guide outputs 55.

Figure 6:
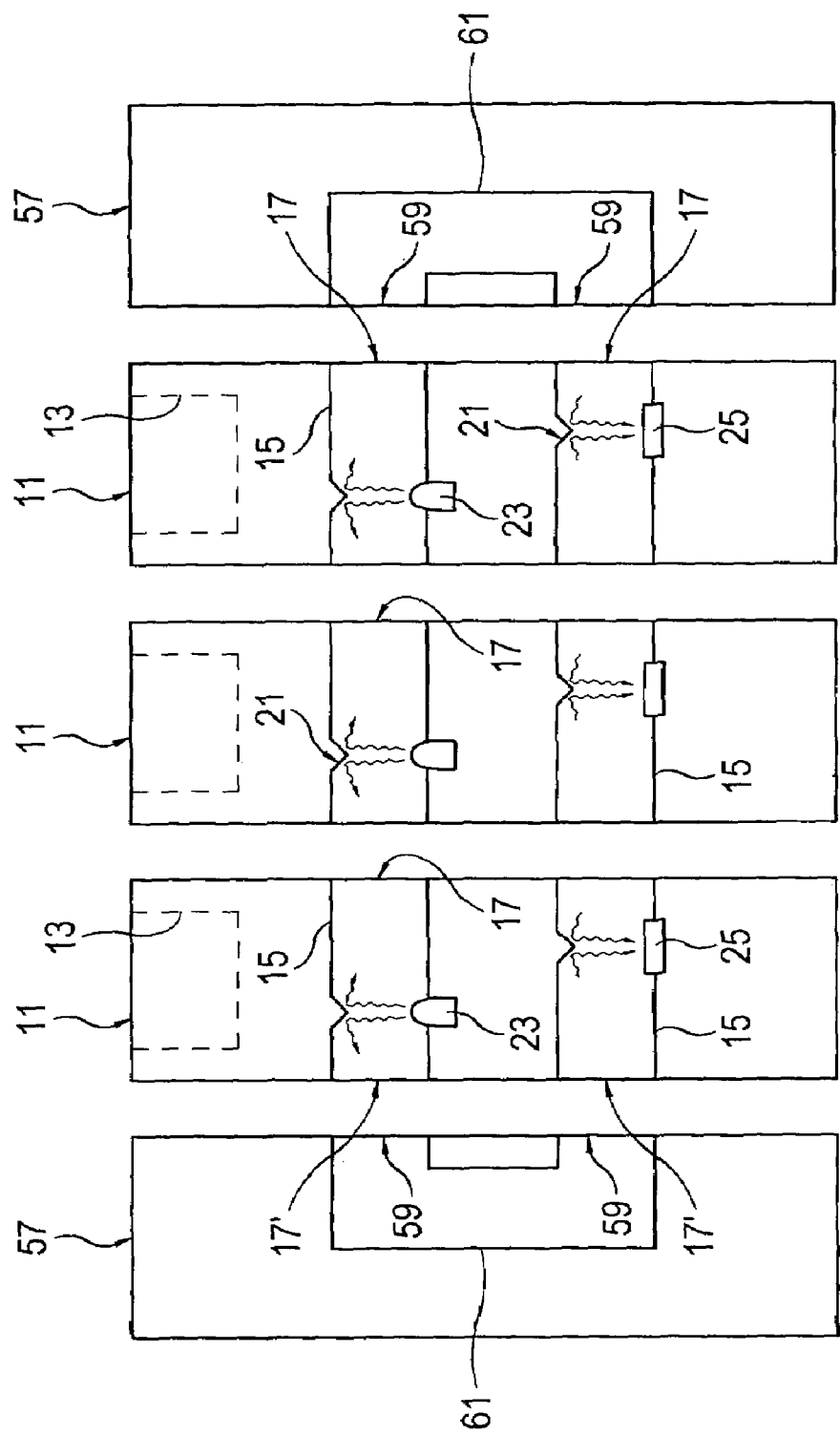
FIG. 6 is a schematic plan view of an alternative embodiment of a system of detector units arranged in series.

FIG. 6 shows an embodiment of a system of detector units 11 which each have two optical connection paths 15. Each optical connection path 15 extends between two optical interfaces 17, 17'. However, only a single recess 21 is provided here at each optical connection path 15, with a light transmitter 23 being provided at the one optical connection path 15 in each case in an opposite position to this recess 21 and a light receiver 25 being provided at the other optical connection path 15.

The optical connection paths 15 each provided with a light transmitter 23 thus form a common transmission path for the transmitted light emitted by the light transmitters 23, and the other optical connection paths 15 each provided with a light receiver 25 form a common reception path.

An optical connection between the transmission path and the reception path is made possible by two terminal units 57 which are provided at both end faces of the series-like arrangement of the detector units 11. The terminal units 57 each have—in a congruent arrangement with the optical interfaces 17, 17' of the detector units 11—two optical interfaces 59 which are optically connected to one another within the relevant terminal unit 57 via an optical connection passage 61.

The invention claimed is:

1. A detection system comprising a plurality of detector units each having spaced-apart, opposite sides, the detector units being arranged adjacent to and in direct contact with each other, each detector unit having a light transmitter, a light receiver, an optical connection path terminating in first and second optical interfaces at the opposites sides, at least one optical anomaly along the optical connection path of the detector unit for coupling light from the light transmitter into the optical connection path and for coupling light out of the optical connection path to the light receiver, a control circuit connected to the light transmitter and the light receiver, and at least a part of a sensor electrically connected to the control circuit, respective optical interfaces of adjacent detector units being in direct areal contact with each other and forming an optical connection path extending along the plurality of detector units.

2. A detector system in accordance with claim 1 wherein the optical connection path is formed by one of a light conductor and a reflecting passage.

3. A detection system in accordance with claim 1 wherein the optical connection path extends in a straight line within each detector unit.

4. A detection system in accordance with claim 1 wherein at least one of the first and second optical interfaces comprise at least one of a terminal window transparent to the wavelength, a housing section transparent to the wavelength, a terminal adapter for the connection of a connection light guide, and a terminal adapter for the reception of a reflecting terminal element.

5. A detection system in accordance with claim 1 wherein the optical anomaly comprises at least one of a totally reflecting recess of the optical connection path and a partly transmitting reflection element.

6. A detection system in accordance with claim 1 wherein each detector unit has a single light transmitter for coupling light from the light transmitter into the optical connection path and a single light receiver for receiving light from the optical connection path.

7. A detection system in accordance with claim 1 wherein the optical interfaces, the optical anomaly, the light transmitter and the light receiver are arranged to optically connect the optical interfaces to each other and wherein each of the optical interfaces is optically connected to the light transmitter and to the light receiver.

8. A detection system in accordance with claim 1 wherein the light transmitter and the light receiver comprise a transceiver element.

9. A detection system in accordance with claim 1 wherein each detector unit has first and second optical connection paths connecting the first and second optical interfaces, the light transmitter with an associated optical anomaly being arranged at the first optical connection path and the light receiver with another associated optical anomaly being arranged at the second optical connection path.

10. A detection system in accordance with claim 1 wherein the at least part of the sensor comprises at least a part of an optoelectronic sensor, or a part of a sensor device including an optical or electrical interface to a sensor head.

11. A detection system in accordance with claim 1 wherein the optical interfaces of adjacent detector units are provided in a congruent arrangement.

12. A detection system in accordance with claim 1 including an adapter unit having an optical interface and at least one light guide output connected optically or optoelectronically thereto, the optical interface of the adapter unit being provided in a congruent arrangement to the optical interface of an adjacent detector unit.

13. A detection system in accordance with claim 1 including at least one terminal unit having a terminal reflector in a congruent arrangement to the optical interface and an adjacent detector unit.

14. A detection system in accordance with claim 1 including at least one terminal unit having first and second optical interfaces and an optical connection path connecting the first and second optical interfaces, the first and second optical interfaces being arranged congruently to the optical interfaces of an adjacent detector unit.

15. A detection system in accordance with claim 1 wherein the control unit is adapted to synchronize the optical bus.

16. A detection system according to claim 1 wherein the sensor is not optically coupled to the optical connection path.

* * * * *